(12) United States Patent
Yehezkely

(10) Patent No.: US 12,696,381 B2
(45) Date of Patent: Jul. 28, 2026

(54) ELECTROSTATIC DISCHARGE COLLECTOR

(71) Applicant: Wiliot, Ltd., Caesarea (IL)

(72) Inventor: Alon Yehezkely, Haifa (IL)

(73) Assignee: Wiliot, Ltd., Caesarea (IL)

( * ) Notice: Subject to any disclaimer, the term of this patent is extended or adjusted under 35 U.S.C. 154(b) by 239 days.

(21) Appl. No.: 18/503,647

(22) Filed: Nov. 7, 2023

(65) Prior Publication Data

US 2025/0151189 A1     May 8, 2025

(51) Int. Cl.
*H05K 1/02*     (2006.01)
*H05K 1/185*     (2026.01)

(52) U.S. Cl.
CPC ........... *H05K 1/0259* (2013.01); *H05K 1/185* (2013.01); *H05K 2201/051* (2013.01); *H05K 2201/09227* (2013.01)

(58) Field of Classification Search
CPC ................. H05K 1/0259; H05K 1/185; H05K 2201/051; H05K 2201/09227
See application file for complete search history.

(56) References Cited

U.S. PATENT DOCUMENTS 6,469,258 B1 * 10/2002 Lee ...................... H05K 1/0259
174/260

* cited by examiner

*Primary Examiner* — Jeremy C Norris
(74) *Attorney, Agent, or Firm* — M&B IP Analysts, LLC

(57)     ABSTRACT

According to a first aspect of the present disclosed subject matter, an electronic circuit printed on a substrate by roll-to-roll system having grounding brushes, the electronic circuit, comprising: a plurality of traces; and at least one electrostatic discharge (ESD) collector; wherein the ESD collector envelops the plurality of traces, and wherein the ESD collector is disposed on the substrate to enable electrical contact with the grounding brushes.

11 Claims, 3 Drawing Sheets

100

S101

FORMING PATTERNS OF ELECTRICAL
CONDUCTORS and ESD-COLLECTOR

S102

ATTACHING ELECTRONIC COMPONENTS

S103

INLAYING ELECTRONIC-CIRCUITS
OF THE ROLL

S104

PRODUCING
ELECTRONIC-PRODUCTS

ELECTROSTATIC DISCHARGE COLLECTOR

TECHNICAL FIELD

The present disclosed subject matter relates to electrostatic discharge (ESD). More particularly, the present disclosed subject matter relates to preventing ESD during the process of producing printed circuits.

BACKGROUND

Roll-to-roll (R2R) processing efficiently integrates large-area manufacturing processes for functional films and printed electronic circuitry, covering a wide range from simple LED light strip tape to complex circuitry, including Near-Field Communication (NFC) devices, Radio Frequency Identification (RFID) tags, Radio frequency Identification-N(RAIN) tags, Organic Light-Emitting Diode (OLED), Bluetooth devices, and various passive/active radio devices.

The R2R manufacturing process uses flexible substrate material stored as rolls. These substrates can be paper, foil, plastics, textiles, metals, or nanomaterials. During R2R processing, the material is laminated, coated, printed, or embedded on the moving substrate as it goes from one reel to another. This step, known as converting, results in a re-reeled product.

In an R2R manufacturing process, electrostatic charge accumulates on a flexible strip used as a substrate for electronic circuits during the repetitive coiling and uncoiling of the strip. This accumulation is caused by triboelectric charging, which occurs when materials contact, slide, and separate, leading to electric charge separation. These charges can potentially harm silicon-based components when attached to the strip's conductive traces through coupling and conduction from statically charged objects like the strip. As chips decrease in size, safeguarding against ESD becomes increasingly challenging due to device sensitivity and the space required for protection. Despite the presence of measures such as grounded brushes and ionization guns in some R2R systems for discharging static electricity, the high number of damaged integrated circuits (ICs) per production batch indicates a low yield.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "some embodiments" or "certain embodiments" may be used herein to refer to a single embodiment or multiple embodiments of the disclosure.

According to a first aspect of the present disclosed subject matter, an electronic circuit printed on a substrate by a roll-to-roll system having grounding brushes, the electronic circuit, comprising: a plurality of traces; and at least one electrostatic discharge (ESD) collector; wherein the ESD collector envelops the plurality of traces, and wherein the ESD collector is disposed on the substrate to enable electrical contact with the grounding brushes.

In some exemplary embodiments, the ESD collector and the plurality of traces are traces made of conductive material and wherein the substrate is made of dielectric material.

In some exemplary embodiments, the electronic circuit is printed along and across a rolled substrate.

In some exemplary embodiments, ESD collector envelopes in the rolled substrate are electrically connected.

In some exemplary embodiments, traces of the ESD collector are substantially wider than the plurality of traces to provide larger contact surfaces for the grounded brushes.

In some exemplary embodiments, the plurality of traces and the ESD collector are together printed to the substrate-roll using any one technique: deposition of conductive inks, and etching.

According to another aspect of the present disclosed subject matter, a method of printing electronic circuits on a substrate comprising: forming patterns of the plurality of traces and the ESD-collector; attaching electronic components; inlaying electronic-circuits; and producing electronic-products.

In some exemplary embodiments, forming patterns of the plurality of traces further comprises: sequential printing of a plurality of electronic circuits along and across a rolled substrate.

In some exemplary embodiments, printing the ESD collector and the plurality of traces is performed together using the same technique.

In some exemplary embodiments, attaching electronic components further is performed with any one technique: flip-chip bonding, wire bonding, and thermal compression.

In some exemplary embodiments, inlaying comprises encapsulation and lamination used to protect the electronic-circuits from environmental physical damage.

In some exemplary embodiments, producing comprises converting an inlaid electronic-circuits into devices; and inlay and dicing each electronic-circuits in the roll into an electronic product.

BRIEF DESCRIPTION OF THE DRAWINGS

The subject matter disclosed herein is particularly pointed out and distinctly claimed in the claims at the conclusion of the specification. The foregoing and other objects, features and advantages of the disclosure will be apparent from the following detailed description taken in conjunction with the accompanying drawings.

In the drawings.

DETAILED DESCRIPTION

Figure 1:
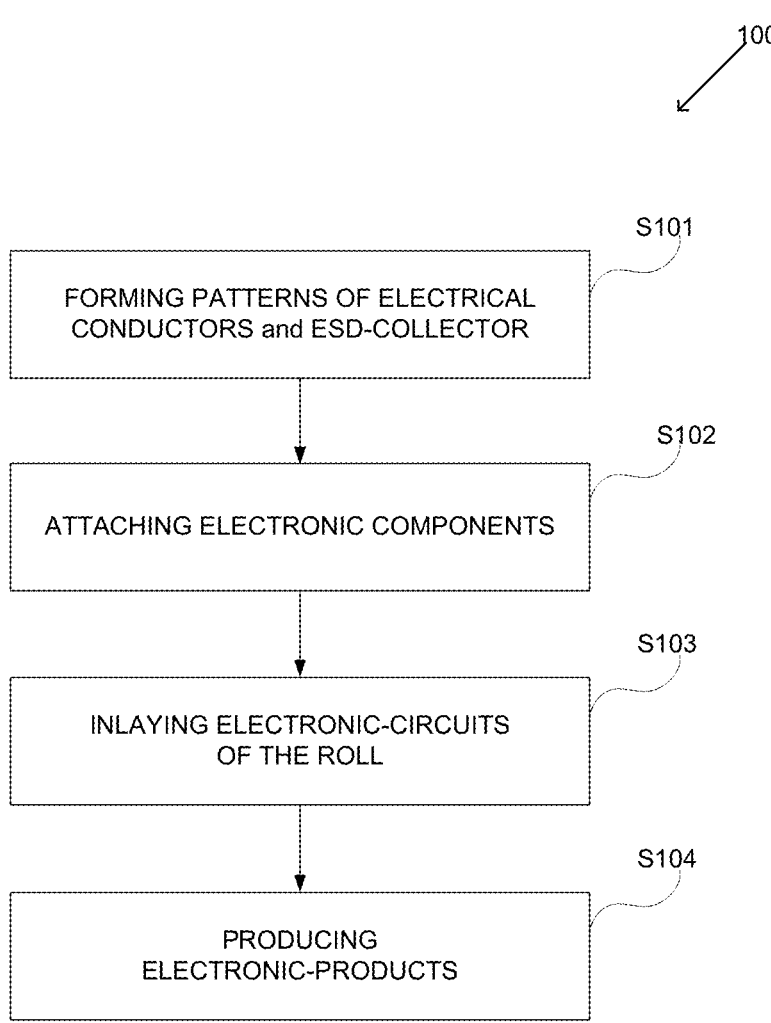
FIG. 1 shows a flowchart diagram depicting an example of a manufacturing process for electronic devices using a roll-to-roll (R2R) method.

The embodiments disclosed herein are only examples of the many possible advantageous uses and implementations of the innovative teachings presented herein. In general, statements made in the specification of the present application do not necessarily limit any of the various claimed embodiments. Moreover, some statements may apply to some inventive features but not to others. In general, unless otherwise indicated, singular elements may be plural and vice versa with no loss of generality. In the drawings, like numerals refer to like parts through several views.

One technical problem addressed by the disclosed subject matter is the accumulation of electrostatic charge on a thin flexible strip used as a substrate for electronic circuits, while the strip moves from one reel to another in a typical R2R manufacturing process.

The repetitive process of coiling, i.e., rolling up the strip of dielectric material, such as the substrate of a flexible electronic circuit, and rerolling it in an R2R process, generates static electricity, known as triboelectric charging. The triboelectric charging effect is caused by the separation of electric charges that occurs when two materials come into contact, slide against each other, and then separate. These electrostatic charges potentially damage silicon-based components when they are being attached to conductive traces, i.e., conductors, on the strip through induction from an isolated statically charged object, e.g., the flexible strip of the roll, into the silicon.

Although some R2R systems are equipped with grounded brushes and ionization guns to discharge static electricity from the moving strip, the number of damaged ICs per production batch indicates a low yield.

One technical solution is to incorporate an Electrostatic Discharge (ESD) collector (to be described in detail further below) into every flexible circuit under production. The ESD collector may be made of a conductive material and bounded by the outer perimeter of the electronic circuit under production. In some embodiments, the ESD collector may be an integral part of the electronic circuit under production, undergoing the same material deposition and printing process on the substrate as the conductors of the electronic circuit.

In some exemplary embodiments, ESD collector traces can be placed within available gaps, to be later removed during the final processing stage. The width of the ESD collector can significantly exceed that of the circuit's conductor, allowing it to accumulate the majority of electrostatic charges. This, in turn, provides larger contact surfaces for the grounded brushes in R2R systems.

One technical effect of utilizing the disclosed subject matter includes increasing the yield of flexible electronic circuits in an R2R production process as well as reducing quality control and testing costs.

FIG. 1 shows a flowchart diagram 100 depicting an example of a manufacturing process for electronic devices using the R2R method.

Certain electronic devices, such as LED light strips, NFC devices, RFID tags, Chip-On-Film (COF), RAIN tags, Bluetooth devices, energy harvesting devices, passive, and active Internet-of-Things (IoT) devices, and the like, are manufactured using a multiple-stage R2R production method.

In the electronic devices industry, roll-to-roll (R2R) is a process for creating electronic devices on a roll of flexible material, such as plastic or metal foil. Practically, this involves applying coatings, printing, or performing other processes on a roll of flexible material and then re-reeling it after the process to create an output roll. After the rolls of material have been coated, laminated, or printed, they can subsequently be diced to their finished size.

Such processes, also known as 'printed electronics,' are a technology that uses printing techniques to create electronic devices on various substrates. The printing techniques include deposition of conductive inks to manufacture flexible electronic components and circuits. Additionally, the circuit printing process can be prepared subtractively by depositing etch masks on a conductive layer of the substrate, i.e., etching.

The roll is, in fact, a long flexible strip used as a substrate (substrate-roll) for patterning electronic circuitry. The strip may be up to a few meters wide and kilometers long, and it is coiled into a roll. The strip can accommodate at least one electronic circuit. In some configurations, the substrate may be made of dielectric materials, such as polyimide, polyethylene terephthalate, any type of polymer, flexible glass, and the like, or any combination thereof. Additionally, alternatively, the substrate may be composed of dielectric material coated or partially coated with conductive materials, such as aluminum, copper, and the like, or any combination thereof.

In some process applications, electronic circuit manufacturing in the R2R method involves multiple steps. However, it should be noted that some components are processed separately and can be integrated into the R2R production process at a later stage, where the circuit may undergo additional processing steps before yielding an electronic product.

As an example, a manufacturing process of a wireless passive IoT device involves several steps to create a functional and efficient antenna connected to integrated circuits (IC) and other electronic components.

The manufacturing process starts by assembling a roll on an R2R production line. In some process applications, a roll made of a long flexible strip used as a substrate may be fed into the R2R production line to undergo substrate preparation by cleaning and smoothing its surface.

At S101, electrical conductors' patterns of at least one electrical-circuit may be formed. In some process applications, conductive traces are formed for each electrical circuit in the roll. The traces of each electrical-circuit are formed in patterns that make up at least one antenna structure and traces for connecting components of the electrical-circuit with the antenna. The forming of the electrical conductors, i.e., printing, may utilize various techniques like conductive ink printing, etching, or etching on a substrate.

In some process applications, the conductor's formation involves conductive material deposition, typically copper, or aluminum that is deposited onto the substrate, which may be done by screen printing, inkjet printing, or sputtering. In some process applications, following the conductive material deposition, subtractive etching techniques are used to remove excess material to create the desired antenna shape and pattern.

In some process applications, S102 further includes annealing the antenna to enhance the electrical conductivity and mechanical properties of the antenna. The annealing involves subjecting the antenna to controlled heating and cooling cycles to remove any stress and improve the material properties.

S101 further comprising forming an Electrostatic Discharge (ESD) collector pattern for at least one electrical circuit may be formed. In some exemplary embodiments, the ESD collector may be added by R2R systems to any design pattern of each electronic circuit under production. Therefore, it undergoes the same material deposition and printing process on the substrate as the conductors of the electronic circuit.

In some exemplary embodiments, the ESD collector is an electrostatic discharge structure incorporated into each electronic circuit within the roll. The ESD collector is made of a conductive material that entirely envelops the circuit. Additionally, or alternatively, the width of the ESD collector's conductors can be significantly wider than the circuit's conductors, effectively accumulating the majority of electrostatic charges. This feature allows for larger contact surfaces with grounded brushes of R2R systems, thereby facilitating the grounding of electrostatic charges from the circuits. This, in turn, helps prevent electrostatic discharge that could potentially damage components of the circuits.

At S102, electronic components may be attached. In some embodiments, upon completion of the antenna manufacturing process, electronic components, including an IC (silicon), can be attached to each electrical-circuit of the roll. The electronic components can be attached using methods such as flip-chip bonding, wire bonding, and thermal compression. The attachment process may involve adhesive bonding, soldering, or other techniques depending on the electronic components and substrate materials.

It should be noted that upon completion of the antenna process step, the strip is re-reeled to create an output roll. Moreover, the output roll may be removed and transported to a different R2R production line for attaching electronic components.

At S103, electronic-circuits on the roll may be inlaid. In some process applications, following the attachment of electronic components, each electronic-circuit on the roll is inlaid. The inlay serves as encapsulation/lamination that protects the electronic-circuits from environmental factors such as moisture, dust, and physical damage.

At S104, electronic-products may be produced. In some process applications, the production involves converting the inlaid electronic-circuits into labels devices tags and the like, or any combination thereof. This may include processes such as, but not limited to, embedding inlay into labels, and dicing each one of the electronic-circuits on the roll into electronic products.

It should be noted that the repetitive process of coiling, i.e., coiling a strip of dielectric material, such as the substrate of a flexible electronic-circuit, and rerolling it in an R2R process generates static electricity known as triboelectric charging. The triboelectric charging effect is the separation of electric charges that occurs when two materials come into contact, slide against each other, and then separate.

Electrostatic discharge (ESD) can damage the IC through induction from an isolated static electrically charged object, e.g., the flexible strip of the roll, into the silicon (IC) during the attachment step. This causes the redistribution of electrical charges on the surface of the isolated object, potentially leading to an ESD event when it contacts a conductive path. For this reason, some of the R2R systems in the process line are equipped with grounded brushes to discharge static electricity, and ionization guns are used in the process.

Figure 2:
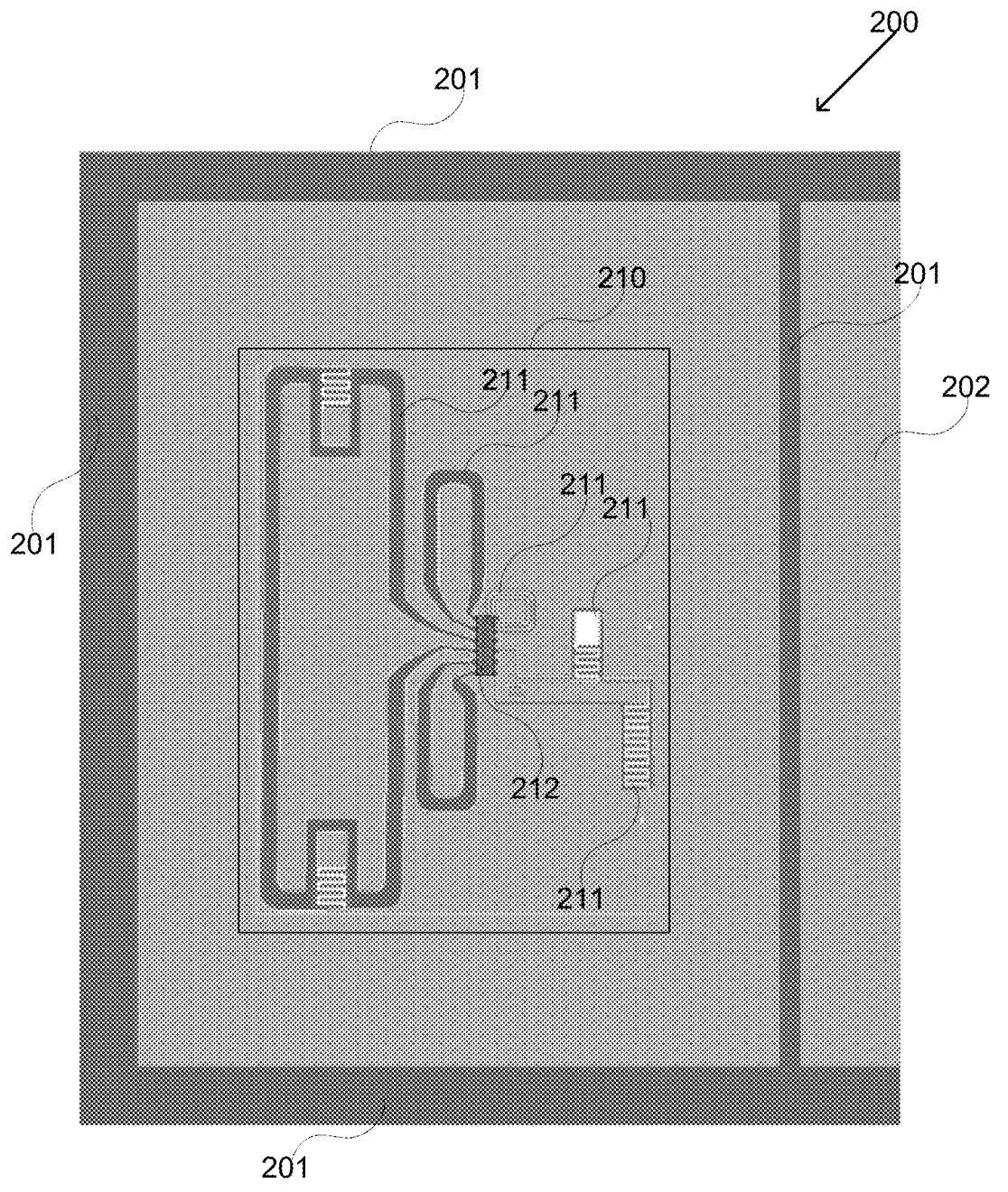
FIG. 2 illustrates an electronic-circuit, in some exemplary embodiments of the disclosed embodiments.

FIG. 2 illustrates an electronic-circuit 200 designed and manufactured according to the disclosed embodiments. Electronic-circuit 200 may be a circuit that includes an electronic-product 210 and an ESD collector 201.

It should be noted that electronic-circuit 200 can be one of a plurality of electronic-circuits that are printed on a thin and flexible substrate 102, which is conveyed from one roll to another in an R2R processing line.

In some exemplary embodiments, electronic-product 210 may be a wireless device configured to store information, harvesting electromagnetic energy, sensing, and communicating information. Examples of such devices include passive and active IoT devices, NFC devices, RFID tags, RAIN tags, Bluetooth devices, energy harvesting devices, and the like. Active and passive IoT devices may include battery-less IoT devices.

Electronic-product 210 may be comprised of an integrated circuit (IC) 212 and at least one antenna 211. In some exemplary embodiments, electronic-product 210 includes a plurality of antennas 211 each having a different pattern adapted to transmitting and receiving electromagnetic energy in distinct frequency ranges. Additionally, or alternatively, may include sensing electrodes, and an RF impact reduction filter.

The plurality of antennas 211, the connections to IC 212, and ESD collector 201 are made of conductive metals, such as copper, aluminum, and the like, or any combination thereof, which are embedded onto substrate 202. This can be achieved through etching or printing methods.

In the etching method, substrate 202 has a metal layer from which undesired metal is removed using chemicals, leaving only the desired conductors on the substrate 202.

In the printing method, a conductive material is applied on top of a dielectric substrate 202 based on the design layout of the conductors for the circuit, including the plurality of antennas 211, ESD collector 201, and the rest of the electrical conductors.

In some exemplary embodiments, upon completion of step S102 (of FIG. 1), IC 212 and additional electronic components (not shown) may be attached to a plurality of electronic-circuits 200 in a roll, following the process outlined in S104 (of FIG. 1).

In some exemplary embodiments, the plurality of electronic-circuit 200 in the roll may undergo an inlaying process, which involves encapsulating/laminating the plurality of electronic-circuits 200 to shield them from environmental factors like moisture, dust, light, temperature, gases, and other physical damage.

In some exemplary embodiments, following the inlaying process, each electronic-product 210 (marked by a broken line) of the plurality of electronic-products 210 may be diced out (separated) from each electronic-circuit 200 of the plurality of electronic-circuit 200 within the roll.

In some example embodiments, ESD collector 201 is an electrostatic discharge structure incorporated in each electronic-circuit 200 of the roll. ESD collector 201 incorporates at least one conductive trace that envelops the plurality of traces of electronic-product 210. ESD collector 201 is made of a conductive material that surrounds electronic-product 210. In some embodiments, the width of the ESD collector 201 can be significantly wider than the width of the circuit's conductor, thereby accumulating the majority of the electrostatic charges. This enables larger contact surfaces with ionizer gun and grounded brushes of R2R apparatuses, thereby facilitating grounding electrostatic charges off the electronic-product 210, thus reducing ESD that can damage IC 212 during the attachment in S104 (of FIG. 3) and throughout the R2R process.

In some exemplary embodiments, the ESD collector 201 is an electrostatic discharge structure incorporated into each electronic-circuit 200 within the roll. The ESD collector 201 is made of conductive material that envelops the electronic product 210. In certain embodiments, the width of the ESD collector 201 conductors can be significantly wider than the circuit's conductor, effectively accumulating the majority of electrostatic charges. It should be appreciated that all ESD collector 201 within the roll are electrically connected to each other to create a continuous conductive path for discharging at the brush.

This design choice allows for larger contact surfaces with the grounded brushes of R2R apparatuses, thereby facilitating the grounding of electrostatic charges from the electronic-product 210. This, in turn, helps prevent electrostatic discharge (ESD) that could potentially damage the IC 212 during attachment in S104 (of FIG. 3) and throughout the R2R process. It should be noted that even without the discharge path through the brushes, the electrostatic charge accumulated on the conductors is smaller due to the increase in the number of conductors, i.e., ESD collector 201, that spread the charges on the roll.

Figure 3:
FIG. 3 illustrates a portion of a roll having a plurality of the electronic-circuits, in accordance with some exemplary embodiments of the disclosed embodiments.
Figure 3:
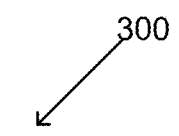

FIG. 3 illustrates a portion 300 of a roll having a plurality of the electronic-circuit 200, in accordance with some exemplary embodiments of the disclosed embodiments.

The embodiments disclosed herein, and specifically the method described with reference to FIG. 1, can be implemented as hardware, firmware, software, or any combination thereof. The application program may be uploaded to, and executed by, a machine comprising any suitable architecture. Preferably, the machine is implemented on a computer platform having hardware such as one or more central processing units ("CPUs"), a memory, and input/output interfaces.

The computer platform may also include an operating system and microinstruction code. The various processes and functions described herein may be either part of the microinstruction code or part of the application program, or any combination thereof, which may be executed by a CPU, whether or not such computer or processor is explicitly shown. The computer platform may be part of an R2R system or a control of an R2R system performing the process described with reference to FIG. 1.

In addition, various other peripheral units may be connected to the computer platform such as an additional network fabric, storage unit and a printing unit. Furthermore, a non-transitory computer-readable medium is any computer-readable medium except for a transitory propagating signal.

It should be understood that any reference to an element herein using a designation such as "first," "second," and so forth does not generally limit the quantity or order of those elements. Rather, these designations are generally used herein as a convenient method of distinguishing between two or more elements or instances of an element. Thus, a reference to the first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

What is claimed is:

1. An electronic circuit printed on a substrate by roll-to-roll system having grounding brushes, the electronic circuit, comprising:

a plurality of traces; and at least one electrostatic discharge (ESD) collector;

wherein the ESD collector envelops the plurality of traces, wherein the ESD collector is disposed on the substrate to enable electrical contact with the grounding brushes, and wherein traces of the ESD collector are substantially wider than the plurality of traces to provide larger contact surfaces for the grounded brushes.

2. The electronic circuit of claim 1, wherein the ESD collector and the plurality of traces are traces made of conductive material and wherein the substrate is made of dielectric material.

3. The electronic circuit of claim 1, wherein the electronic circuit is printed along and across a rolled substrate.

4. The electronic circuit of claim 3, wherein ESD collector envelops in the rolled substrate are electrically connected to one another.

5. The electronic circuit of claim 1, wherein the plurality of traces and the ESD collector are together printed to a substrate-roll using any one technique: deposition of conductive inks, and etching.

6. A method of printing electronic circuits on a substrate of claim 1, comprising:

forming patterns of the plurality of traces and an ESD-collector, wherein the forming results in traces of the ESD-collector pattern being substantially wider than the patterns for the plurality of traces;

attaching electronic components;

inlaying electronic-circuits; and producing electronic-products.

7. The method of claim 6, wherein forming the patterns of the plurality of traces further comprises: sequential printing of a plurality of electronic circuits along and across a rolled substrate.

8. The method of claim 7, wherein printing the ESD collector and the plurality of traces is performed together using the same technique.

9. The method of claim 6, wherein attaching the electronic components is performed with any one technique: flip-chip bonding, wire bonding, and thermal compression.

10. The method of claim 6, wherein inlaying the electronic-circuits further comprises:

encapsulation and lamination used to protect the electronic-circuits from environmental physical damage.

11. The method of claim 6, wherein producing the electronic-products further comprises: converting an inlaid electronic-circuits into devices; and inlay and dicing each electronic-circuits in the roll into an electronic product.

* * * * *